(12) United States Patent
Miki et al.

(10) Patent No.: US 9,024,322 B2
(45) Date of Patent: May 5, 2015

(54) WIRING STRUCTURE AND DISPLAY DEVICE

(75) Inventors: Aya Miki, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/116,935

(22) PCT Filed: Mar. 12, 2012

(86) PCT No.: PCT/JP2012/056328
§ 371 (c)(1),
(2), (4) Date: Nov. 11, 2013

(87) PCT Pub. No.: WO2012/157326
PCT Pub. Date: Nov. 22, 2012

(65) Prior Publication Data
US 2014/0091306 A1      Apr. 3, 2014

(30) Foreign Application Priority Data

May 13, 2011    (JP) .................................. 2011-108765

(51) Int. Cl.
*H01L 29/04* (2006.01)
*H01L 27/12* (2006.01)
(Continued)

(52) U.S. Cl.
CPC ............ *H01L 27/124* (2013.01); *H01L 29/458* (2013.01); *H01L 29/7869* (2013.01); *H01L 29/4908* (2013.01); *H01L 29/495* (2013.01)

(58) Field of Classification Search
CPC .............. H01L 29/458; H01L 29/7869; H01L 27/1225; H01L 29/4958; H01L 23/5233; H01L 27/124; H01L 29/408; H01L 29/495; H01L 29/4908

USPC ................ 257/43, 59, 72, E23.161, E51.005, 257/E29.151, E21.411, E29.117, E29.137, 257/88
See application file for complete search history.

(56) References Cited

U.S. PATENT DOCUMENTS 7,994,503 B2      8/2011   Hino et al.
8,120,029 B2 *    2/2012   Park et al. ........................ 257/57
(Continued)

FOREIGN PATENT DOCUMENTS

JP        3220760 B2      10/2001
JP        2004 71920       3/2004
(Continued)

OTHER PUBLICATIONS

International Search Report Issued May 15, 2012 in PCT/JP12/056328 Filed Mar. 12, 2012.
(Continued)

*Primary Examiner* — Cuong Q Nguyen
*Assistant Examiner* — Yosef Gebreyesus
(74) *Attorney, Agent, or Firm* — Oblon, McClelland, Maier & Neustadt, L.L.P.

(57) ABSTRACT

Provided is a technique that allows oxidation of Cu wires to be effectively prevented during plasma processing when forming a passivation film for a display device that utilizes an oxide semiconductor layer. This wiring structure comprises a semiconductor layer (oxide semiconductor) for a thin film transistor, a Cu alloy film (laminated structure comprising a first layer (X) and a second layer (Z)), and a passivation film that are formed on a substrate, starting from the substrate side. The first layer (X) is made of an element that exhibits low electrical resistivity, such as pure Cu; and the second layer contains a plasma-oxidation-resistance improving element. The second layer (Z) is directly connected, at least partially, to the passivation film.

11 Claims, 3 Drawing Sheets

(51) Int. Cl.
  *H01L 29/45* (2006.01)
  *H01L 29/786* (2006.01)
  *H01L 29/49* (2006.01)

(56) References Cited

U.S. PATENT DOCUMENTS

| | | |
|---|---|---|
| 8,482,189 B2 | 7/2013 | Goto et al. |
| 8,535,997 B2 | 9/2013 | Kawakami et al. |
| 8,558,382 B2 | 10/2013 | Maeda et al. |
| 2005/0170643 A1* | 8/2005 | Fujii et al. .................. 438/637 |
| 2006/0091792 A1 | 5/2006 | Kugimiya et al. |
| 2006/0275618 A1 | 12/2006 | Kugimiya et al. |
| 2007/0002239 A1* | 1/2007 | Koike ........................ 349/139 |
| 2010/0133531 A1* | 6/2010 | Akimoto et al. ............. 257/43 |
| 2010/0207121 A1 | 8/2010 | Hino et al. |
| 2011/0079776 A1* | 4/2011 | Choi et al. .................. 257/43 |
| 2011/0089421 A1* | 4/2011 | Choi et al. .................. 257/59 |
| 2011/0147753 A1 | 6/2011 | Onishi et al. |
| 2011/0273075 A1* | 11/2011 | Goto et al. ................ 313/311 |
| 2013/0026470 A1 | 1/2013 | Terao et al. |
| 2013/0122323 A1 | 5/2013 | Miki et al. |
| 2013/0140066 A1 | 6/2013 | Okuno et al. |

FOREIGN PATENT DOCUMENTS

| | | | |
|---|---|---|---|
| WO | WO 2010082637 A1 * | 7/2010 | ............ H01L 23/532 |
| WO | 2011 013683 | 2/2011 | |

OTHER PUBLICATIONS

Written Opinion of the International Searching Authority May 15, 2012 in PCT/JP12/056328 Filed Mar. 12, 2012.

* cited by examiner

WIRING STRUCTURE AND DISPLAY DEVICE

TECHNICAL FIELD

The present invention relates to a wiring structure including a semiconductor layer of a thin-film transistor, a Cu alloy film used for an electrode, and a passivation film, the semiconductor layer, the Cu alloy film, and the passivation film being arranged above a substrate in that order from the substrate, the semiconductor layer being made of an oxide semiconductor, and also relates to a display device including the wiring structure. The wiring structure according to the present invention is typically used in, for example, display devices such as liquid crystal display devices and organic EL display devices.

BACKGROUND ART

In recent years, in the field of display devices, the market of 3D display devices and organic EL display devices has been expanding. As a demand for an increase in definition and image quality increases, Cu wiring materials of low resistance and oxide semiconductors which are high-mobility semiconductor materials are receiving much attention. The oxide semiconductors are expected to be about ten times higher in mobility than conventional a-Si. Copper is lower in resistivity than Al. The electrical resistivity of Al is $2.5 \times 10^{-6}$ $\Omega \cdot cm$, whereas the electrical resistivity of Cu is low, $1.6 \times 10^{-6}$ $\Omega \cdot cm$.

By the way, for a thin-film transistors (TFT) for use in display devices, it is necessary to form a passivation film (passivation layer) made of an insulating oxide such as $SiN_x$, $SiON$, or $AlO_x$ on the channel region of the TFT in order to suppress the time-dependent deterioration of TFT properties. The passivation film is usually formed (deposited) by a plasma-enhanced CVD process, a sputtering process, or the like. An example of a method for forming an $SiN_x$ passivation film by a plasma CVD process is a method in which $SiN_x$ is formed by allowing a gas mixture of $SiH_4$ and $N_2O$ to react in high-frequency plasma with an industrial frequency of 13.56 MHz and is deposited on an oxide semiconductor film. The following method has been proposed: a method for forming an $Al_2O_3$ passivation film by a reactive sputtering process using oxygen.

However, when a passivation film is formed, radicals or molecules sped up by plasma collide with the surface of an oxide semiconductor to apply plasma damage to an oxide semiconductor layer or hydrogen diffuses from the passivation film to make the oxide semiconductor layer conductive in some cases. Therefore, in order to prevent the reduction of TFT properties due to surface defects (damage) of the oxide semiconductor during the formation of the passivation film, for example, Non-patent Literature 1 proposes a method in which an oxide semiconductor layer is rendered non-conductive in such a way that the surface of an oxide semiconductor is excessively oxidized in advance by irradiating the oxide semiconductor surface with $N_2O$ plasma just before a passivation film is formed (plasma treatment prior to the formation of the passivation film).

In a display device including such an oxide semiconductor layer, plasma treatment (the formation of a film or the removal of a surface layer in a plasma environment) is performed in a step of forming a passivation layer or prior thereto. In this operation, the surface of a Cu wiring line used for source-drain electrodes is exposed to plasma containing oxygen atoms, thereby causing a problem that the surface of the Cu wiring line is oxidized. The surface oxidation of the Cu wiring line makes the adhesion of the Cu wiring line to a passivation film placed thereon insufficient; hence, a wiring failure such as the uplift of the passivation film may possibly occur and a problem such as an increase or variation in contact resistance with a transparent conductive film may possibly occur. If an oxide layer is formed by the surface oxidation of the Cu wiring line, then the surface roughness of the Cu wiring line increases and therefore the coverage of the passivation film becomes insufficient. This allows the entry of water from outside. Therefore, the primary role of the passivation film, that is, the effect of suppressing the time-dependent deterioration of TFT properties is not sufficiently obtained or failures due to the oxidation or corrosion of wiring lines may possibly occur.

Techniques for preventing the oxidation of Cu wiring lines used in integrated circuits or the like for semiconductor devices have been proposed as described in Patent Literatures 1 to 4 below.

Patent Literatures 1 and 2 each disclose a method in which an oxide film with excellent oxidation resistance is formed in such a way that Al or Si is diffusively concentrated near the surface of a wiring line by oxidizing a Cu alloy containing Al or Si. In particular, this method is as follows: a predetermined oxide film is formed by making use of annealing (heat treatment) at about 300° C. to 500° C. in the course of fabricating TFTs or by performing oxidative heat treatment at 500° C. or lower separately from annealing. Patent Literature 3 discloses a method in which an Al—Cu alloy film is formed so as to entirely cover the surface of a Cu wiring line. Patent Literature 4 discloses a technique in which the oxidation of a Cu wiring line by an etching agent or a photoresist stripper is suppressed in such a way that a copper compound layer made of copper phosphide, copper boride, copper bromide, or copper nitride on the surface of the Cu wiring line.

CITATION LIST

Patent Literature

PTL 1: Japanese Unexamined Patent Application Publication No. 6-177128
PTL 2: Japanese Unexamined Patent Application Publication No. 6-177117
PTL 3: Japanese Unexamined Patent Application Publication No. 5-102155
PTL 4: Japanese Unexamined Patent Application Publication No. 2000-165002

NON PATENT LITERATURE

NPL 1: J. Park et al., Appl. Phys. Lett., 1993, 053505 (2008)

SUMMARY OF INVENTION

Technical Problem

However, the techniques disclosed in Patent Literatures 1 and 2 cannot be directly used to prevent the oxidation of a Cu wiring line in plasma process as cited in the present invention. The technique disclosed in Patent Literature 3 needs to adjust the composition proportion of Al in the AlCu alloy film to be 0.3 or more; hence, a process is complicated and the load of the process is large. The technique disclosed in Patent Literature 4 requires novel plasma treatment, leading to an increase in process cost.

None of the techniques disclosed in the above patent literatures is intended to prevent the oxidation of a Cu wiring line used in a display device including an oxide semiconductor layer or is investigated from the viewpoint of providing a technique for suppressing the oxidation of a Cu wiring line particularly by plasma treatment during the formation of a passivation film (providing, for example, a technique capable of effectively preventing oxidation in the course of forming a conventional passivation film without adding any new step).

Thus, it is desired to provide a technique capable of effectively prevent the oxidation of a Cu wiring line by plasma treatment during the formation of a passivation film (including a forming step and a treatment step prior to the formation thereof as described above in Non-patent Literature 1).

The present invention has been made in view of the above circumstances and has an object to provide a technique capable of effectively prevent the oxidation of a Cu wiring line by plasma treatment during the formation of a passivation film in a conventional formation process basically without newly adding any special step, in a display device including an oxide semiconductor layer.

Solution to Problem

The present invention provides a wiring structure and display device below.

(1) The wiring structure includes a semiconductor layer of a thin-film transistor, a Cu alloy film used for an electrode, and a passivation film, the semiconductor layer, the Cu alloy film, and the passivation film being arranged above a substrate in that order from the substrate.

The semiconductor layer is made of an oxide semiconductor.

The Cu alloy film has a multilayer structure including a first layer (X) and second layer (Z) arranged in that order from the substrate.

The first layer (X) is made of pure Cu or a Cu alloy which mainly contains Cu and which is lower in electrical resistivity than the second layer (Z).

The second layer (Z) is made of a Cu—Z alloy containing two to 20 atomic percent of at least one element Z selected from the group consisting of Zn, Ni, Ti, Al, Mg, Ca, W, Nb, rare-earth elements, Ge, and Mn in total.

At least one portion of the second layer (Z) is directly connected to the passivation film.

(2) In the wiring structure specified in (1), the thickness of the second layer (Z) is 5 nm to 100 nm and is 60% or less of the thickness of the Cu alloy film.

(3) In the wiring structure specified in (1), the passivation film contains at least one of silicon oxide and silicon oxynitride.

(4) In the wiring structure specified in (2), the passivation film contains at least one of silicon oxide and silicon oxynitride.

(5) The display device includes the wiring structure specified in any one of (1) to (4).

Advantageous Effects of Invention

According to the present invention, the following line is used as a Cu alloy film: a multilayer wiring line including a second layer (Z) which is placed on the side directly connected to a passivation layer and which contains an element capable of inhibiting the oxidation of Cu in the course of forming the passivation film and a first layer (X) which contributes to reducing the electric resistance of the whole Cu alloy film. Therefore, in a display device including an oxide semiconductor layer, the following technique can be provided: a technique capable of effectively preventing the oxidation of a Cu wiring line by plasma treatment during the formation of the passivation film in a conventional forming process basically without newly adding any special step.

DESCRIPTION OF EMBODIMENTS

A feature of the present invention is that in a display device (a display device including an oxide semiconductor layer of a thin-film transistor, a Cu alloy film used for an electrode, and a passivation film, the oxide semiconductor layer, the Cu alloy film, and the passivation film being arranged above a substrate in that order from the substrate) including an oxide semiconductor layer, a Cu alloy film composed of a predetermined multilayer structure is used as a Cu wiring film to readily prevent the oxidation of a Cu wiring line by plasma treatment during the formation of a passivation film with high productivity. In particular, the Cu alloy film is composed of a multilayer structure including a first layer (X) and second layer (Z) arranged in that order from a substrate. The second layer (Z) includes at least one portion directly connected to the passivation film and is made of a Cu alloy containing an element (hereinafter referred to as a plasma oxidation resistance-enhancing element and collectively referred to as a Z-group element in some cases) preventing the oxidation of the Cu wiring line by plasma treatment during the formation of the passivation film. This allows the oxidation of Cu to be suppressed in a passivation film-forming process using plasma because of the predominant oxidation of the Z-group element. Meanwhile, the first layer (X) is placed under the second layer (Z) and is made of a low-electrical resistivity material (pure Cu or a Cu alloy which mainly contains Cu and which is lower in electrical resistivity than the second layer (Z)). This enables the reduction of the electrical resistivity of the whole Cu alloy film. Such a multilayer structure allows an innate feature of Cu that is lower in electrical resistivity than Al to be effectively maximized and also allows a problem (the deterioration of TFT properties by the oxidation of the Cu wiring line in the passivation film-forming process) with using the oxide semiconductor layer to be effectively suppressed.

Moreover, according to the present invention, there is a merit that the oxidation of the Cu wiring line during the formation of the passivation film can be preferably prevented by directly following a conventional process without adding new treatment to a passivation film-forming step using a conventional plasma CVD process or plasma sputtering process. The passivation film is usually formed by plasma CVD using a source gas, such as $N_2O$, containing an oxygen atom as described above. Plasma pretreatment is preferably performed using an oxygen atom-containing source gas as described above in Non-patent Literature 1. The Z-group element, which is used in the present invention, is diffused on the surface of a Cu film and is oxidized prior to Cu element by a deposition process or plasma pretreatment. Therefore, an oxide barrier layer suppressing the oxidation of Cu is formed at the interface between the passivation film and the Cu film. That is, the formation of the oxide barrier layer can be naturally performed in the thermal history of the formation of the passivation film and a source gas atmosphere without purposely performing special treatment and therefore can be said to be an extremely useful method from the viewpoint of productivity and cost. Of course, heat treatment for forming the oxide barrier layer may be separately performed prior to, for example, a plasma deposition process. Such an embodiment is included in the scope of the present invention.

In this application, elements used in the second layer (Z), that is, elements preventing the oxidation of the Cu wiring line by plasma treatment during the formation of the passivation film are collectively referred to as a plasma oxidation resistance-enhancing element or a Z-group element in some cases. The term "during the formation of a passivation film" as used herein includes not only a step of forming the passivation film but also a pretreatment step prior to the formation of the passivation film as described in Non-patent Literature 1 and particularly means both a plasma deposition process (including CVD and PVD such as sputtering) using an oxygen atom-containing gas and plasma treatment, prior to the deposition process, using an oxygen atom-containing gas.

Figure 1:
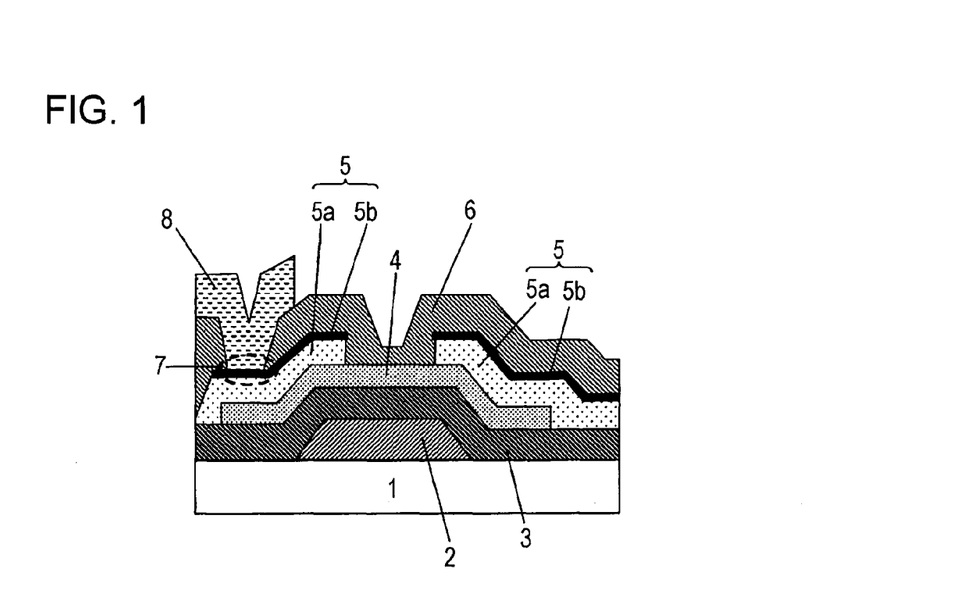
FIG. 1 is a schematic sectional view of a typical wiring structure (including no barrier metal).
Figure 2:
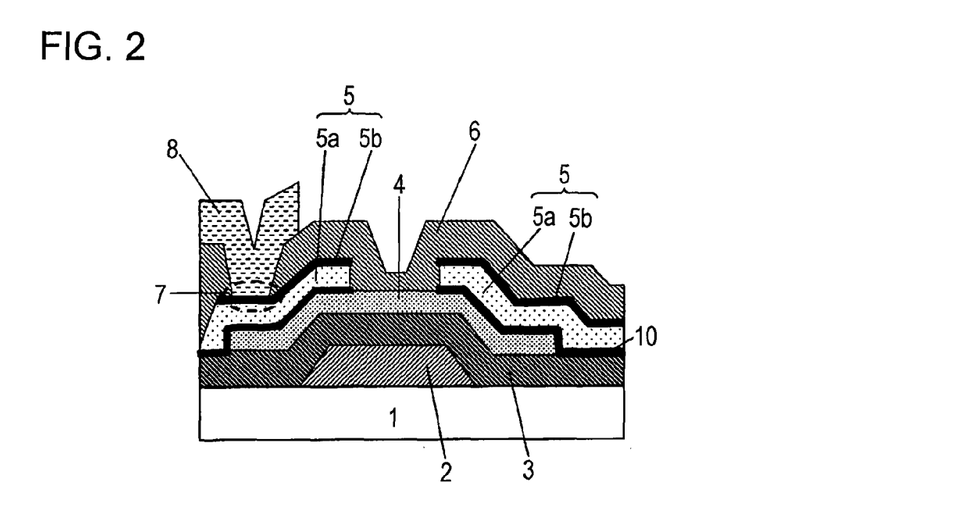
FIG. 2 is a schematic sectional view of another typical wiring structure (including a barrier metal).

A wiring structure according to the present invention is described below in detail with reference to FIG. 1 (also FIG. 2). FIGS. 1 and 2 differ from each other only in that each of barrier metal layers 10 is not placed between an oxide semiconductor layer 4 and a corresponding one of Cu alloy films 5 (in particular, first layers (X) 5a) (FIG. 1) or is placed therebetween (FIG. 2). FIGS. 1 and 2 are the same except that. The present invention is never intended to be limited to these figures and, of course, includes other embodiments meeting requirements of the present invention. For example, FIG. 1 (and FIG. 2) exemplifies a TFT array substrate having a bottom gate structure. The present invention is not limited to it and may be applied to a TFT array substrate having a top gate structure.

As illustrated in FIG. 1, a gate electrode 2 and a gate insulating film 3 are formed on a substrate 1 and the oxide semiconductor layer 4 is formed thereon. Source-drain electrodes 5 made of a Cu alloy are formed on the oxide semiconductor layer 4 and a passivation film 6 is formed thereon. A transparent conductive film 8 is electrically connected to the drain electrode 5 through a contact hole 7.

Copper alloy films which are most characteristic of the present invention and which form the source electrode-drain electrodes 5 are described. Each Cu alloy film has a multilayer structure including a first layer (X) 5a and second layer (Z) 5b arranged in that order from the substrate as illustrated in FIG. 1. At least one portion of the second layer (Z) 5b is directly connected to the passivation film 6.

The first layer (X) 5a is made of pure Cu or a Cu alloy which mainly contains Cu and which is lower in electrical resistivity than the second layer (Z) 5b. The presence of the first layer (X) 5a allows the electrical resistivity of the whole Cu alloy film to be held low.

The term "mainly contains Cu" for the first layer (X) means that the mass of Cu or the number of atoms of Cu is largest among elements forming a material. From the viewpoint of electrical resistivity, Cu is preferably substantially 95 atomic percent or more.

The type and/or content of an alloy element in the first layer (X) 5a may be appropriately controlled such that the "Cu alloy which is lower in electrical resistivity than the second layer (Z)" is lower in electrical resistivity than the second layer (Z), which is made of a Cu—Z alloy with an excellent plasma oxidation resistance-enhancing action. A low-electrical resistivity element (an element that is substantially as low as a Cu alloy) can be readily selected from known elements with reference to values cited in literatures. However, the alloy element, which can be used in the first layer (X), is not necessarily limited to the low-electrical resistivity element because the electrical resistivity can be reduced if the content of even a high electrical resistivity element is reduced (to about 0.05 atomic percent to one atomic percent). In particular, for example, Cu-0.5 atomic percent Ni, Cu-0.5 atomic percent Zn, Cu-0.3 atomic percent Mn, or the like is preferably used. The Cu alloy, which can be used in the first layer (X), may contain a gas component such as an oxygen gas or a nitrogen gas and, for example, Cu—O, Cu—N, or the like can be used. The Cu alloy, which is lower in electrical resistivity than the second layer (Z), contains the above usable element, the remainder being substantially Cu and inevitable impurities. Examples of the inevitable impurities include Fe, Si, O, N, and C, which may be contained up to about 200 ppm.

The second layer (Z) 5b, which is most characteristic of the present invention, is made of the Cu—Z alloy. The Cu—Z alloy contains two to 20 atomic percent of at least one Z-group element (plasma oxidation resistance-enhancing element) selected from the group (Z-group) consisting of Zn, Ni, Ti, Al, Mg, Ca, W, Nb, rare-earth elements, Ge, and Mn in total. These elements may be used alone or in combination. When one of these elements is contained, the content of one thereof may meet the above range. When two or more of these elements are contained, the total content of thereof may meet the above range. These elements are those selected from a large number of basic experiments as these elements prevent the oxidation of Cu wiring lines by plasma treatment during the formation of passivation films. When a Cu alloy containing these elements in the form of solid solutions is exposed to thermal history in the course of forming the passivation film and plasma containing oxygen atoms, the Z-group element is probably formed into an oxide barrier layer suppressing the oxidation of Cu because the Z-group element is diffused on the surface of a Cu film and is oxidized prior to Cu element. The Z-group element is extremely excellent in wet etchability as described in examples below.

Examples of a rare-earth element used in the present invention include an element group including the lanthanoid series (totaling 15 elements ranging from atomic number 57, La, to atomic number 71, Lu, in the periodic table) plus Sc (scandium) and Y (yttrium). In the present invention, these elements can be used alone or in combination. The content of the rare-earth element is the single amount or the total amount when one or more, respectively, of these elements are contained. The rare-earth element is preferably one or more selected from the group consisting of Nd, Gd, La, Y, Ce, Pr, and Dy.

Among the above Z-group elements, Mn, Ni, Ge, Zn, and Mg are preferred and Mn, Ni, and Zn are more preferred. This is because these elements are those very strongly exhibiting a thickening phenomenon on the above-mentioned surface. That is, these elements migrate from the inside to outside (film surface side) of a film by the thermal history of the formation of the passivation film and plasma containing oxygen atoms. The migration of the element to an interface is further promoted because a phenomenon in which an oxide of the element is formed by plasma containing oxygen atoms in the passivation film-forming process acts as driving force. As a result, an oxide layer of the element is formed on the surface of a Cu wiring line and therefore the oxidation of Cu is probably suppressed.

An oxidation barrier layer due to the predominant oxidation of the Z-group element may be formed by (I) plasma treatment (including a CVD process and a PVD process such as sputtering using plasma) prior to the formation of the passivation film or (II) a plasma deposition process (including a CVD process and a PVD process such as sputtering using plasma) during the formation of the passivation film, preferably after the Cu alloy is deposited by sputtering. In both Methods (I) and (II), the Z-group element is predominantly oxidized because the whole of a TFT device is exposed to plasma and heat history is applied thereto. Thus, above (I) and (II) may be performed alone or (II) may be performed subsequently to (I). In the latter case, in consideration of productivity, it is recommended that PVD or CVD is performed in the same chamber.

Methods (I) and (II) may be performed in the passivation film-forming step. Alternatively, heat treatment corresponding to above (I) may be separately performed prior to the formation of the passivation film.

In particular, after the first layer (X) 5a is formed in such a way that a material for forming the first layer (X) 5a is deposited by a sputtering process, the second layer (Z) 5b is formed in such a way that a material for forming the second layer (Z) 5b is deposited thereon by the sputtering process, whereby the multilayer structure is formed. Since the Cu alloy film can be formed by the sputtering process so as to have substantially the same composition as that of a sputtering target, the composition of the Cu alloy film can be adjusted by adjusting the composition of the sputtering target. The composition of the sputtering target may be adjusted using Cu alloy targets different in composition from each other or may be adjusted in such a way that a metal corresponding to the alloy element is chipped on a pure Cu target. In the sputtering process, the composition of the deposited Cu alloy film is slightly different from the composition of the sputtering target in some cases. However, the difference therebetween is within approximately a few atomic percent. Thus, the Cu alloy film can be formed so as to have a desired composition in such a way that the composition of the sputtering target is controlled within the range of up to ±10 atomic percent.

Sputtering conditions for forming the first layer (X) 5a and the second layer (Z) 5b are general conditions and may be appropriately employed. Sputtering conditions used in the present invention are as exemplified below and are not intended to be limited to the following. Sputtering conditions may be different or the same depending on the formation of each layer.

Sputtering gas: Ar
DC deposition power: about 0.28 W/cm$^2$

After a Cu alloy multilayer film is formed in this way and is then subjected to predetermined patterning, the Cu alloy multilayer film is preferably tapered in cross section so as to have a taper angle of about 45° to 60° from the viewpoint of coverage.

Next, the passivation film 6 is deposited on the second layer (Z) 5b by plasma treatment. A deposition method used may be a CVD process or a PVD process such as sputtering. A method usually used to form the passivation film can be used by appropriately selecting conditions for optimizing properties of the oxide semiconductor.

Before the passivation film 6 is formed by the plasma treatment, plasma treatment may be performed as pretreatment. For example, a method described in Non-patent Literature 1 can be performed as the pretreatment.

The content (the single amount or the total amount when one or more, respectively, are contained) of the Z-group element is two atomic percent or more. When the content of the Z-group element is less than two atomic percent, a sufficient effect against oxidation by plasma is not obtained. The more the content of the Z-group element is, the more effective the oxide barrier layer is formed. However, when the content of the Z-group element is more than 20 atomic percent, the electrical resistivity of the Cu alloy film (wiring film) itself (the first layer plus the second layer) is high and it is difficult to manufacture the sputtering target. From these, the lower limit of the content of the Z-group element is preferably three atomic percent and more preferably four atomic percent. The upper limit of the content of the Z-group element is preferably 18 atomic percent, more preferably 15 atomic percent, and further more preferably 12 atomic percent.

A Cu—Z alloy film used in the present invention contains the above elements, the remainder being Cu and inevitable impurities. Examples of the inevitable impurities include Fe, Ag, and P. The inevitable impurities are allowed to be contained up to 0.1% in total.

The Cu alloy film, which is used in the present invention, has the multilayer structure including the first layer (X) 5a and the second layer (Z) 5b, which are different in composition from each other, as described above and therefore exhibits desired properties. In order to more effectively exhibit these properties, it is particularly effective to control the thickness of the second layer (Z) 5b. In particular, it is preferred that the thickness of the second layer (Z) 5b is 5 nm or more and is 60% or less of the thickness of the Cu alloy film (the sum of the thickness of the first layer (X) 5a and the thickness of the second layer (Z) 5b). This allows both low electrical resistivity and high plasma oxidation resistance to be achieved. It is more preferred that the thickness of the second layer (Z) 5b is 10 nm or more and is 50% or less of the thickness of the Cu alloy film.

The upper limit of the thickness of the second layer (Z) 5b may be appropriately determined principally in consideration of the electrical resistivity of the wiring film itself, is preferably 100 nm or less, and is more preferably 80 nm or less. The lower limit of the proportion of the first layer (X) 5a in the thickness of the Cu alloy film is not particularly limited and is preferably about 15% in consideration of a plasma oxidation resistance-enhancing effect.

The thickness of the whole Cu alloy film (the first layer (X) 5a plus the second layer (Z) 5b) is preferably about 200 nm to 600 nm and more preferably 250 nm to 400 nm.

In order to most effectively exhibit a plasma oxidation resistance-enhancing effect due to the formation of the second layer (Z) 5b, the content of the Z-group element and the thickness of the second layer (Z) are not separately controlled but are preferably controlled in relation to each other. This is because experiment results obtained by the inventors have revealed that a plasma oxidation resistance-enhancing action is closely associated with the amount of the Z-group element present in the second layer (Z) 5b. In particular, for example, the thickness of the second layer (Z) 5b can be controlled to be large when the content of the Z-group element is small, whereas the content of the Z-group element can be controlled to be small or large when the thickness of the second layer (Z) 5b is small.

In order to connect the Cu alloy film, which is used in the present invention, to a semiconductor layer of a TFT, the oxide semiconductor layer 4 may be directly connected to the Cu alloy film 5 (in particular, the first layer (X) 5a) as illustrated in FIG. 1 or the following structure may be formed as illustrated in FIG. 2: a three-layer structure in which each barrier metal layer 10 made of a refractory metal such as Mo or Ti is placed at the interface between the oxide semiconductor layer 4 and the Cu alloy film 5 (in particular, the first layer (X) 5a). The structure illustrated in FIG. 2 allows the adhesion between the oxide semiconductor layer 4 and the Cu alloy film 5 to be high.

The Cu alloy films, which are most characteristic of the present invention, have been described above. The Cu alloy films, which are used in the present invention, are excellent in plasma oxidation resistance as described above and therefore are preferably used as wiring films in direct contact with passivation films and films for electrodes. In the present invention, a source electrode and/or a drain electrode is composed of each Cu alloy film and the composition of other wiring sections (for example, a gate electrode) is not particularly limited. Referring to FIG. 1, for example, the gate electrode, a scanning line (not shown), and a drain wiring section (not shown) may be composed of the Cu alloy films. In this case, all Cu alloy wiring lines placed above a TFT substrate can be made to have the same composition.

The present invention is characterized by the Cu alloy films and other requirements are not particularly limited.

The oxide semiconductor layer 4 is not particularly limited; may be made of, for example, an oxide semiconductor for use in liquid crystal display devices; and is one made of an oxide containing at least one selected from the group consisting of, for example, In, Ga, Zn, Ti, and Sn. Examples of the oxide include transparent oxides such as In oxide, In—Sn oxide, In—Zn oxide, In—Sn—Zn oxide, In—Ga oxide, Zn—Sn oxide, Zn—Ga oxide, In—Ga—Zn oxide, Zn oxide, and Ti oxide; AZTO obtained by doping Zn—Sn oxide with Al; and GZTO obtained by doping Zn—Sn oxide with Ga.

As the transparent conductive film 8, which forms a pixel electrode, an oxide conductive film usually used in liquid crystal display devices is cited and a conductive film made of an oxide containing at least one selected from the group consisting of, for example, In, Ga, Zn, and Sn is also cited. Typically, amorphous ITO, poly-ITO, IZO, ZnO, and the like are exemplified.

The passivation film 6, which is formed on an oxide semiconductor, is not particularly limited and those, such as silicon nitride, silicon oxide, and silicon oxynitride, usually used in the field of display devices are cited. However, the oxide semiconductor loses its excellent properties in a reducing atmosphere. Therefore, from the viewpoint of effectively exhibiting properties of the oxide semiconductor, silicon oxide or silicon oxynitride, which can be used to form a film in an acidic atmosphere, is preferably used. In particular, the passivation film 6 need not necessarily be made of a single compound (for example, silicon oxide only). An insulating film containing at least oxygen to an extent sufficient to effectively exhibit properties of the oxide semiconductor can be used in the present invention.

Furthermore, the gate insulating film 3 is not particularly limited, usually used in the field of display devices. For example, silicon nitride, silicon oxide, and silicon oxynitride, and the like are cited. The type of the gate insulating film 3 may be the same as or different from the type of the passivation film 6.

The substrate 1 is not particularly limited and may be one for use in liquid crystal display devices or the like. Typically, a transparent substrate represented by a glass substrate or the like is cited. A material for the glass substrate is not particularly limited and may be one for use in liquid crystal display devices or the like. For example, alkali-free glass, high-strain point glass, soda lime glass, and the like are cited. Alternatively, a flexible resin film, a metal foil, or the like can be used.

The manufacture of a display device including the above-mentioned wiring structure is not particularly limited except that requirements of the present invention are satisfied and heat treatment-thermal history conditions for the Cu alloy films are adapted to the conditions recommended above. General steps for display devices may be used.

EXAMPLE

The present invention is further described below in detail with reference to an example. The present invention is not limited to the example. Appropriate modifications can be made within the scope adaptable to the gist described above or below and are included in the technical scope of the present invention.

Example 1

In this example, samples simulating a passivation film-forming process were prepared and were measured for electrical resistivity and processability during wet etching and an oxide layer formed on each Cu alloy film was measured for thickness by methods below.

(Preparation of Samples)

Glass substrates (Eagle XG produced by Corning Inc., a diameter of 50.8 mm, a thickness of 0.7 mm) were prepared. Copper alloy films were prepared by a sputtering process below in such a way that pure Cu as first layers (X) and Cu—Z alloys containing various elements shown in Table 1 as second layers (Z) were deposited (Nos. 3 to 38 in Table 1). For comparison, in No. 1, a sample was prepared in such a way that pure Cu as a second layer (Z) was deposited and in No. 2, a sample was prepared in such a way that a pure Mo film as a second layer (Z) was deposited. The thickness of each layer is as shown in Table 1.

Sputtering Conditions

Sputtering system: trade name "HSM-552" manufactured by Shimadzu Corporation
 DC magnetron sputtering process
 Back pressure: $0.27 \times 10^{-3}$ Pa or less
 Ar gas pressure: 0.27 Pa
 Ar gas flow rate: 30 sccm
 Sputtering power: DC 260 W
 Target-substrate distance: 50.4 mm
 Substrate temperature: room temperature Sputtering Targets:

Pure Cu was used for a sputtering target to form a pure Cu film. Pure Mo was used for a sputtering target to form a pure Mo film. Sputtering targets prepared by a vacuum melting process were used to form Cu alloy films containing various elements.

The composition of the Cu alloy films, which were formed in the above way, was confirmed by quantitative analysis using an ICP emission spectrometer (an ICP emission spectrometer, "ICP-8000 Model", manufactured by Shimadzu Corporation).

Next, after $N_2O$ plasma treatment was performed as pre-treatment, passivation films (a thickness of 150 nm) made of $SiO_2$ were formed by a plasma CVD method. These treatments were continuously performed in the same chamber using "PD-200NL" manufactured by SAMCO Inc. Detailed conditions for each treatment are as described below.

$N_2O$ plasma treatment conditions (pretreatment)
RF power: 100 W
Gas flow rate: $N_2O$ 100 sccm
Temperature: 150° C.
Treatment time: five minutes
Conditions for forming passivation film by plasma CVD process
RF power: 100 W
Source gases: $SiH_4$ gas and $N_2O$ diluted with $N_2$ were used.
Gas flow rate (sccm): $N_2O/SiH_4/N_2$=100/4/36
Temperature: 150° C.

(Measurement of Electrical Resistance)

The electrical resistance of each sample (having a passivation film for $SiO_2$) prepared as described above was measured at room temperature by a direct-current four-probe method. For comparison, the electrical resistance of each sample (having no passivation film for $SiO_2$) was measured in the same manner as above before the passivation film for $SiO_2$ was formed.

In this example, a sample in which the ratio of the electrical resistance of the sample having no passivation film for $SiO_2$ to the electrical resistance of the sample having a passivation film for $SiO_2$ was 1.20 or less was evaluated to be acceptable (to have low electrical resistance).

(Evaluation of Processability)

After each sample (having a passivation film for $SiO_2$) prepared as described above was processed using a photoresist, TSMR 8900 (produced by Tokyo Ohka Kogyo Co., Ltd.), so as to have a line-and-space pattern (50 μm intervals), the sample was cut into test specimens with a size of 1 cm×4 cm. Each test specimen was etched in such a way that the test specimen was immersed in an etchant. Etching conditions are as described below.

Etchant: Cu-02 produced by Kanto Chemical Co., Inc.
Processing temperature: room temperature
Amount of chemical solution: 100 ml
Treatment method: static (immersion)
Processing time: etching was performed for a time corresponding to 150% (from just etching to 50% over-etching) of the time taken to confirm the removal of a wiring film by etching, where the time taken to confirm the removal thereof is 100%.

Figure 5:
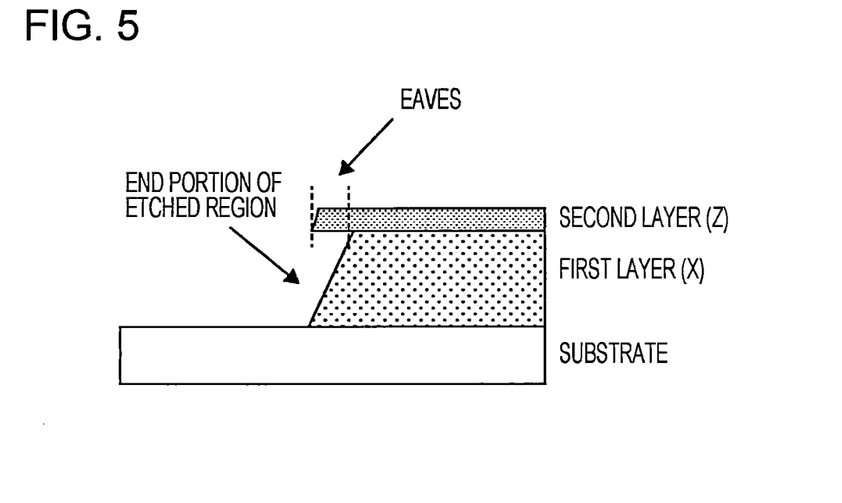
FIG. 5 is an illustration showing eaves used to evaluate processability.

Next, the resist was removed and a cross section of a film on an end surface of the test specimen was observed with a scanning electron microscope (a magnification of 30,000×). An etched test specimen having a Cu alloy film with eaves was rated as B (poor processability) and an etched test specimen having a Cu alloy film with no eaves was rated as A (good processability). As used herein, the term "eaves" refers to one in which an etched end of a second layer remains and protrudes clearly as compared to an etched end of a first layer when a cross section of an end portion of an etched region is observed with an SEM as described above. For reference, FIG. 5 illustrates the state of a cross section of an end portion of an etched region with remaining eaves.

(Measurement of Thickness of Oxide Layer)

For each sample (having a passivation film for $SiO_2$) prepared as described above, a cross section of the Cu alloy film was observed with a TEM (a magnification of 300,000×) and the thickness of an oxide film formed on the surface thereof was measured.

In this example, one having an oxide layer with a thickness 0.75 times or less that of No. 1 (the first layer and the second layer are both pure Cu) was rated as A (excellent in plasma oxidation resistance) and one having an oxide layer with a thickness more than 0.75 times that of No. 1 was rated as B.

These results are summarized in Table 1. The rightmost column of Table 1 is provided with the item "comprehensive judgment" and shows that one in which items (electrical resistivity, processability, oxide layer thickness) evaluated in this example were all rated as A is evaluated to be acceptable (A) and one in which at least one of the items was rated as B is judged to be unacceptable (B).

TABLE 1

| | Cu electrode | | | | Electrical resistivity | | | Thickness of oxide layer | | | |
|---|---|---|---|---|---|---|---|---|---|---|---|
| | Second layer (Z) | | First layer (X) | | | | Electrical resistivity ratio | Thickness (nm) | Pure Cu proportion | | Comprehensive judgment |
| No. | Composition | Thickness | Composition | Thickness | Containing no $SiO_2$ | Containing $SiO_2$ | | | | Processability | |
| 1 | Cu | 100 | Cu | 200 | 2.0 | 2.6 | 1.32 | 73 | 1.00 | A | B |
| 2 | Mo | 50 | Cu | 300 | 2.3 | 2.3 | 1.00 | | | B | B |
| 3 | Cu—0.5Mn | 50 | Cu | 300 | 2.1 | 2.6 | 1.21 | 65 | 0.89 | A | B |
| 4 | Cu—0.5Mn | 100 | Cu | 300 | 2.2 | 2.5 | 1.13 | 67 | 0.92 | A | B |
| 5 | Cu—1Mn | 100 | Cu | 300 | 2.3 | 2.5 | 1.08 | 57 | 0.79 | A | B |
| 6 | Cu—2Mn | 50 | Cu | 300 | 2.2 | 2.3 | 1.04 | 42 | 0.57 | A | A |
| 7 | Cu—2Mn | 100 | Cu | 300 | 2.4 | 2.5 | 1.04 | 42 | 0.57 | A | A |
| 8 | Cu—4Mn | 50 | Cu | 300 | 2.3 | 2.3 | 1.01 | 10 | 0.14 | A | A |
| 9 | Cu—8Mn | 50 | Cu | 300 | 2.3 | 2.3 | 1.00 | 8 | 0.11 | A | A |
| 10 | Cu—10Mn | 50 | Cu | 300 | 2.3 | 2.3 | 1.00 | 7 | 0.10 | A | A |
| 11 | Cu—12Mn | 50 | Cu | 300 | 2.3 | 2.3 | 1.00 | 7 | 0.10 | A | A |
| 12 | Cu—16Mn | 50 | Cu | 300 | 2.3 | 2.3 | 1.00 | 7 | 0.09 | A | A |
| 13 | Cu—20Mn | 50 | Cu | 300 | 2.3 | 2.3 | 1.00 | 7 | 0.09 | A | A |
| 14 | Cu—0.5Ni | 50 | Cu | 300 | 2.1 | 6.0 | 2.91 | 68 | 0.93 | A | B |
| 15 | Cu—2Ni | 50 | Cu | 300 | 2.2 | 2.3 | 1.06 | 46 | 0.62 | A | A |
| 16 | Cu—4Ni | 50 | Cu | 300 | 2.2 | 2.3 | 1.02 | 18 | 0.25 | A | A |
| 17 | Cu—8Ni | 50 | Cu | 300 | 2.3 | 2.3 | 1.01 | 16 | 0.22 | A | A |
| 18 | Cu—12Ni | 50 | Cu | 300 | 2.3 | 2.3 | 1.00 | 14 | 0.19 | A | A |
| 19 | Cu—16Ni | 50 | Cu | 300 | 2.3 | 2.3 | 1.00 | 14 | 0.19 | A | A |
| 20 | Cu—20Ni | 50 | Cu | 300 | 2.3 | 2.3 | 1.00 | 14 | 0.19 | A | A |
| 21 | Cu—0.5Zn | 50 | Cu | 300 | 2.0 | 4.9 | 2.38 | 67 | 0.92 | A | B |
| 22 | Cu—2Zn | 50 | Cu | 300 | 2.1 | 2.3 | 1.08 | 42 | 0.57 | A | A |

TABLE 1-continued

| | Cu electrode | | | | Electrical resistivity | | Thickness of oxide layer | | | |
|---|---|---|---|---|---|---|---|---|---|---|
| | Second layer (Z) | | First layer (X) | | Containing | Containing | Electrical resistivity | Thickness | Pure Cu | | Compre-hensive |
| No. | Composition | Thickness | Composition | Thickness | no SiO₂ | SiO₂ | ratio | (nm) | proportion | Processability | judgment |
| 23 | Cu—4Zn | 50 | Cu | 300 | 2.2 | 2.2 | 1.01 | 11 | 0.15 | A | A |
| 24 | Cu—8Zn | 50 | Cu | 300 | 2.2 | 2.2 | 1.01 | 11 | 0.12 | A | A |
| 25 | Cu—12Zn | 50 | Cu | 300 | 2.3 | 2.3 | 1.00 | 11 | 0.09 | A | A |
| 26 | Cu—20Zn | 50 | Cu | 300 | 2.3 | 2.3 | 1.00 | 11 | 0.15 | A | A |
| 27 | Cu—1Mg | 50 | Cu | 300 | 2.1 | 3.8 | 1.82 | 66 | 0.90 | A | B |
| 28 | Cu—3Mg | 50 | Cu | 300 | 2.2 | 2.3 | 1.07 | 45 | 0.61 | A | A |
| 29 | Cu—6Mg | 50 | Cu | 300 | 2.2 | 2.3 | 1.02 | 16 | 0.22 | A | A |
| 30 | Cu—9Mg | 50 | Cu | 300 | 2.2 | 2.3 | 1.03 | 37 | 0.44 | A | A |
| 31 | Cu—12Mg | 50 | Cu | 300 | 2.3 | 2.3 | 1.02 | 37 | 0.42 | A | A |
| 32 | Cu—20Mg | 50 | Cu | 300 | 2.3 | 2.3 | 1.02 | 36 | 0.50 | A | A |
| 33 | Cu—1Ge | 50 | Cu | 300 | 2.2 | 4.3 | 1.91 | 67 | 0.92 | A | B |
| 34 | Cu—3Ge | 50 | Cu | 300 | 2.3 | 2.3 | 1.02 | 49 | 0.66 | A | A |
| 35 | Cu—6Ge | 50 | Cu | 300 | 2.3 | 2.3 | 1.00 | 24 | 0.33 | A | A |
| 36 | Cu—9Ge | 50 | Cu | 300 | 2.3 | 2.3 | 1.00 | 24 | 0.51 | A | A |
| 37 | Cu—12Ge | 50 | Cu | 300 | 2.3 | 2.3 | 1.00 | 23 | 0.49 | A | A |
| 38 | Cu—20Ge | 50 | Cu | 300 | 2.3 | 2.3 | 1.00 | 23 | 0.32 | A | A |

From Table 1, Nos. 6 to 13, 15 to 20, 22 to 26, 28 to 32, and 34 to 38 include Cu alloy films having a multilayer structure meeting requirements of the present invention and are excellent in plasma oxidation resistance. The Cu alloy films have low electrical resistivity and good processability.

In contrast, Nos. 3 to 5, 14, 21, 27, and 33 include second layers (Z) in which the content of a Z-group element is low, do not sufficiently exhibit the effect of adding the Z-group element, include oxide layers with a large thickness, and are low in plasma oxidation resistance. Nos. 3, 21, 27, and 33 include second layers (Z) in which the content of the Z-group element is low and of which the thickness is small, 50 nm, have high electrical resistivity. This is probably because oxide layers are grown without sufficiently exhibiting plasma oxidation resistance, the thickness of the unoxidized second layers (Z) is reduced, and therefore the electrical resistivity is high.

Figure 3:
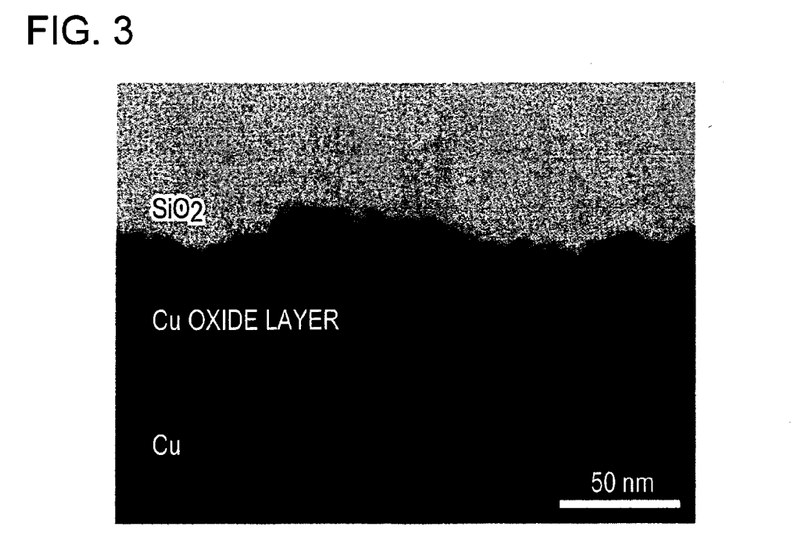
FIG. 3 is a cross-sectional TEM photograph of a conventional wiring structure having a passivation film ($SiO_2$) formed on a Cu wiring line shown in No. 1 of Table 1 of an example.
Figure 4:
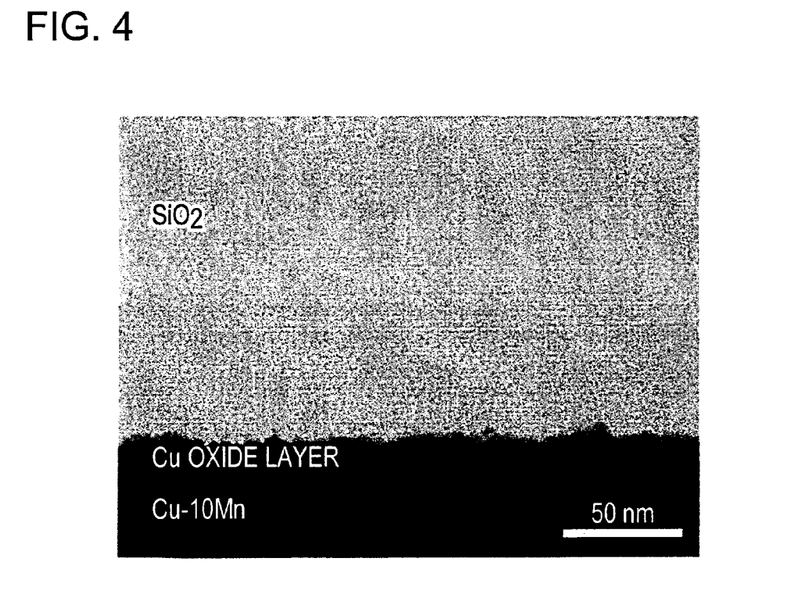
FIG. 4 is a cross-sectional TEM photograph of a wiring structure, according to the present invention, having a passivation film ($SiO_2$) formed on a Cu multilayer wiring line shown in No. 10 of Table 1 of an example.

For reference, FIG. 3 illustrates a cross-sectional TEM photograph of No. 1 (a conventional example using pure Cu) described above and FIG. 4 illustrates a cross-sectional TEM photograph of No. 10 (an example of the present invention). Comparing the two shows that according to the example of the present invention illustrated in FIG. 4, the formation of a Cu oxide layer is significantly suppressed as compared to the conventional example shown in FIG. 3.

In No. 2, which uses pure Mo as a second layer (Z), an oxide layer was hardly formed (not described in Table 1) and the processability was reduced.

While this application has been described above in detail with reference to specific embodiments, it is apparent to those skilled in the art that various variations and modifications can be made without departing from the spirit and scope of the present invention.

This application is based on a Japanese patent application (Japanese Patent Application No. 2011-108765) filed on May 13, 2011, the disclosure of which is incorporated herein by reference.

INDUSTRIAL APPLICABILITY

According to the present invention, the following line is used as a Cu alloy film: a multilayer wiring line including a second layer (Z) which is placed on the side directly connected to a passivation layer and which contains an element capable of inhibiting the oxidation of Cu in the course of forming the passivation film and a first layer (X) which contributes to reducing the electric resistance of the whole Cu alloy film. Therefore, in a display device including an oxide semiconductor layer, the following technique can be provided: a technique capable of effectively preventing the oxidation of a Cu wiring line by plasma treatment during the formation of the passivation film in a conventional forming process basically without newly adding any special step.

REFERENCE SIGNS LIST

1 Substrate
2 Gate electrode
3 Gate insulating film
4 Oxide semiconductor layer
5 Source electrode-drain electrodes (Cu alloy films)
5a First layers (X)
5b Second layers (Z)
6 Passivation film (insulating film)
7 Contact hole
8 Transparent conductive film
10 Barrier metal layers

The invention claimed is:

1. A Cu alloy film, for a wiring structure comprising: an oxide semiconductor layer of a thin-film transistor; the Cu alloy film, which is an electrode; and a passivation film, wherein the oxide semiconductor layer, the Cu alloy film, and the passivation film are arranged above a substrate in that order from the substrate,
   the Cu alloy film has a multilayer structure including a first layer (X) and second layer (Z) arranged in that order from the substrate,
   the first layer (X) is made of pure Cu or a Cu alloy which mainly contains Cu and which is lower in electrical resistivity than the second layer (Z),
   the second layer (Z) is made of a Cu—Z alloy containing 2 to 20 atomic percent of at least one element Z selected from the group consisting of Zn, Ni, Ti, Al, Mg, Ca, W, Nb, rare-earth elements, Ge, and Mn in total, and
   at least one portion of the second layer (Z) is directly connected to the passivation film, and the first layer (X) is in direct contact with the oxide semiconductor layer.

2. The Cu alloy film of claim 1, wherein the thickness of the second layer (Z) is 5 nm to 100 nm and is 60% or less of the thickness of the Cu alloy film.

3. The Cu alloy film of claim 1, wherein the passivation film contains at least one of silicon oxide and silicon oxynitride.

4. The Cu alloy film of claim 2, wherein the passivation film contains at least one of silicon oxide and silicon oxynitride.

5. A display device, comprising the Cu alloy film of claim 1.

6. The Cu alloy film of claim 2, wherein the thickness of the second layer (Z) is from 15 to 50% of the thickness of the Cu alloy film.

7. The Cu alloy film of claim 1, wherein the second layer (Z) is made of a Cu—Mn alloy containing from 4 to 20 atomic percent of Mn.

8. The Cu alloy film of claim 1, wherein the second layer (Z) is made of a Cu—Ni alloy containing from 4 to 20 atomic percent of Ni.

9. The Cu alloy film of claim 1, wherein the second layer (Z) is made of a Cu—Zn alloy containing from 4 to 20 atomic percent of Zn.

10. The Cu alloy film of claim 1, wherein the second layer (Z) is made of a Cu—Mg alloy containing from 3 to 20 atomic percent of Mg.

11. The Cu alloy film of claim 1, wherein the second layer (Z) is made of a Cu—Ge alloy containing from 6 to 20 atomic percent of Ge.

\* \* \* \* \*